(12) United States Patent
Park et al.

(10) Patent No.: US 7,084,076 B2
(45) Date of Patent: Aug. 1, 2006

(54) METHOD FOR FORMING SILICON DIOXIDE FILM USING SILOXANE

(75) Inventors: Jae-eun Park, Yongin (KR); Kang-soo Chu, Suwon (KR); Joo-won Lee, Suwon (KR); Jong-ho Yang, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 163 days.

(21) Appl. No.: 10/782,094

(22) Filed: Feb. 19, 2004

(65) Prior Publication Data

US 2004/0180557 A1  Sep. 16, 2004

Related U.S. Application Data

(63) Continuation-in-part of application No. 10/459,943, filed on Jun. 12, 2003.

(30) Foreign Application Priority Data

Feb. 27, 2003 (KR) ............. 10-2003-0012324
Feb. 4, 2004 (KR) ............. 10-2004-0007104

(51) Int. Cl.
*H01L 21/31* (2006.01)
(52) U.S. Cl. .................... 438/778; 438/787
(58) Field of Classification Search ........ 438/778, 438/787
See application file for complete search history.

(56) References Cited

U.S. PATENT DOCUMENTS

| | | | |
|---|---|---|---|
| 3,313,792 A | 4/1967 | Duck et al. | |
| 5,037,514 A | 8/1991 | Yamazaki | |
| 5,470,800 A | 11/1995 | Muroyama | 437/238 |
| 6,037,275 A | 3/2000 | Wu et al. | 438/780 |
| 6,090,442 A | 7/2000 | Klaus et al. | 427/255.15 |
| 6,270,572 B1 | 8/2001 | Kim et al. | 117/93 |
| 6,391,803 B1 | 5/2002 | Kim et al. | 438/787 |
| 6,465,371 B1 | 10/2002 | Lim | 438/785 |
| 6,534,395 B1 * | 3/2003 | Werkhoven et al. | 438/627 |
| 6,664,156 B1 | 12/2003 | Ang et al. | |
| 2002/0001974 A1 | 1/2002 | Chan | 438/785 |
| 2002/0047151 A1 | 4/2002 | Kim et al. | |
| 2002/0068466 A1 | 6/2002 | Lee et al. | 438/765 |
| 2002/0164890 A1 | 11/2002 | Kwan et al. | |
| 2003/0015764 A1 | 1/2003 | Raajimakers et al. | |
| 2003/0188682 A1 * | 10/2003 | Tois et al. | 117/105 |
| 2004/0096582 A1 | 5/2004 | Wang et al. | |

FOREIGN PATENT DOCUMENTS

EP    1 003 210    5/2000

(Continued)

OTHER PUBLICATIONS

Klaus, J.W., et al., "Atomic layer controlled growth of SiO$_2$ films using binary reaction sequence chemistry," American Institute of Physics, 1997, pp. 1092-1094.

*Primary Examiner*—Tuan H. Nguyen
(74) *Attorney, Agent, or Firm*—Mills & Onello LLP

(57) ABSTRACT

A method is provided for forming a silicon dioxide film using atomic layer deposition (ALD), wherein a halogen- or NCO-substituted siloxane is used as a Si source. The method includes feeding a substituted siloxane as a first reactant onto a substrate to form a chemisorbed layer of the first reactant, and thereafter feeding a compound consisting of oxygen and hydrogen as a second reactant onto the chemisorbed layer to form the desired silicon dioxide film.

55 Claims, 6 Drawing Sheets

FOREIGN PATENT DOCUMENTS

| | | |
|---|---|---|
| EP | 1 096 042 | 5/2001 |
| EP | 1 139 399 | 10/2001 |
| JP | 06132276 | 5/1994 |
| JP | 10189582 | 7/1998 |
| JP | 2001002990 | 1/2001 |
| KR | 02-2579 | 1/2002 |
| KR | 02-44422 | 6/2002 |
| KR | 2002-0085487 | 11/2002 |

* cited by examiner

METHOD FOR FORMING SILICON DIOXIDE FILM USING SILOXANE

This application is a continuation-in-part application of U.S. patent application Ser. No. 10/459,943, filed Jun. 12, 2003, the disclosure of which is incorporated herein in its entirety by reference.

This application claims the priority of Korean Patent Application No. 2003-12324, filed on Feb. 27, 2003 and No. 2004-7104 filed on Feb. 4, 2004, in the Korean Intellectual Property Office, the disclosure of which is incorporated herein in its entirety by reference.

BACKGROUND OF THE INVENTION

1. Field of the Invention

The present invention relates to a method for forming a thin film on a substrate, and more particularly to a method for forming a silicon dioxide film using atomic layer deposition (ALD).

2. Description of the Related Art

As the sizes of microelectronics devices continue to become smaller, the qualities of silicon dioxide films that are used as gate oxide films and dielectric films of electric field effect transistors in semiconductor devices have correspondingly become increasingly important.

Conventionally, in the fabrication of semiconductor devices, silicon dioxide films are mainly formed using thermal chemical vapor deposition (thermal CVD), low pressure CVD (LPCVD), and plasma-enhanced CVD (PECVD). Among these conventional techniques, thermal CVD provides good step coverage but must be carried out at a relatively high temperature. PECVD provides a high deposition rate at a low temperature but poor step coverage. For these reasons, these CVD methods have been used only in a limited manner for silicon dioxide film formation. Recently, as semiconductor devices become highly integrated, a short channel effect caused by high temperatures in CVD methods has also been recognized as a major problem. Therefore, low temperature silicon dioxide film formation methods are required. In addition to the above problems, as the step-to-step height on a semiconductor substrate increases, step coverage becomes poor and a significant undesirable pattern loading effect is caused. Therefore, there is a need to develop improved silicon dioxide film forming methods.

In order to solve the aforementioned problems, there have been proposed methods for forming a silicon dioxide film using atomic layer deposition (ALD). An exemplary method for forming a silicon dioxide film is disclosed in U.S. Pat. No. 6,090,442 in which an ALD process based on $SiCl_4$ and $H_2O$ is used. However, a $SiO_2$ monolayer formed after one ALD cycle has been found to have a low packing density, and furthermore the deposition rate for such process is very slow. For these reasons, a desired throughput requirement in a semiconductor device manufacturing process is not satisfied by this ALD technique. Meanwhile, $SiCl_4$ has four Si—Cl bonds per Si atom. When low temperature vapor deposition is carried out, $H_2O$ has been found to attack the Si—Cl bonds to form O—H bonds. As a result, a large amount of the O—H bonds remain in such an ALD-formed silicon dioxide film, resulting in an undesirably porous silicon dioxide film.

SUMMARY OF THE INVENTION

The present invention provides a method for forming a silicon dioxide film, which is improved both in terms of film quality and throughput, as a result of decreasing impurities in the silicon dioxide film and increasing the film deposition rate.

In accordance with one embodiment of the present invention, there is provided a method for forming a silicon dioxide film comprising the sequential steps of: (a) feeding a halogen- or NCO-substituted siloxane as a first reactant onto a suitable substrate to form a chemisorbed layer of the first reactant on the surface of the substrate; and (b) feeding a second reactant, for example a compound consisting of oxygen and hydrogen as a second reactant onto the chemisorbed layer to react with the chemisorbed layer to form the silicon dioxide film.

According to more specific embodiments of the present invention, the first reactant may be a siloxane represented by the general formula $Si_nO_{n-1}X_{2n+2}$, where n is an integer of 2 to 5, and X is a chemical group selected from F, Cl, Br, I, or NCO. In a preferred embodiment, the first reactant is a halogen- or NCO-substituted disiloxane (i.e., n=2). Most preferably, the first reactant is a siloxane selected from the group consisting of $Si_2OCl_6$, $Si_2OBr_6$, and $Si_2O(NCO)_6$ and the second reactant is selected from the group consisting of $H_2O$, $H_2O_2$, ozone ($O_3$) and oxygen radical.

The method of this invention further comprises removing a first byproduct after step (a) and removing a second byproduct after step (b). The byproducts may preferably be removed by means of inert gas purge and evacuation, either such step being carried out alone or in combination. The evacuation is carried out under a pressure lower than the pressure at which the first and the second reactants are fed onto the substrate.

The method of this invention may further comprise, after a silicon dioxide film with a desired thickness is formed, the step of annealing the silicon dioxide film. The annealing step is carried out using a heat treatment, a plasma treatment, or an ozone treatment.

In accordance with another embodiment of the present invention, there is provided a method for forming a silicon dioxide film comprising the steps of: (a) loading a suitable substrate into a chamber; (b) introducing a siloxane represented generally by the formula $Si_nO_{n-1}X_{2n+2}$, where n is an integer of 2 to 5, and X is a chemical group selected from F, Cl, Br, I or NCO as a first reactant into the chamber together with a first catalyst, such as an amine catalyst to form a chemisorbed layer of the first reactant on the surface of the substrate; (c) removing a byproduct of step (b) from the chamber; (d) introducing a second reactant, such as a compound consisting of oxygen and hydrogen as a second reactant, into the chamber together with a second catalyst such as an amine catalyst, to form the silicon dioxide film on the substrate; and (e) removing a byproduct of step (d) from the chamber.

In accordance with a preferred embodiment of the present invention, a substituted siloxane with at least two Si atoms is used as a Si source. Therefore, the silicon dioxide film formed according to the present invention provides excellent film quality due to a strong siloxane (Si—O—Si) bond, and by decreasing impurities in the film. Furthermore, because two $SiO_2$ monolayers are formed whenever one atomic layer deposition (ALD) cycle is completed, the deposition rate increases. As a result, throughput according to this invention is improved compared with prior art techniques.

BRIEF DESCRIPTION OF THE DRAWINGS

The above and other features and advantages of the present invention will become more apparent by the following description in detail of exemplary embodiments thereof with reference to the attached drawings in which.

DETAILED DESCRIPTION OF THE INVENTION

Figure 1:
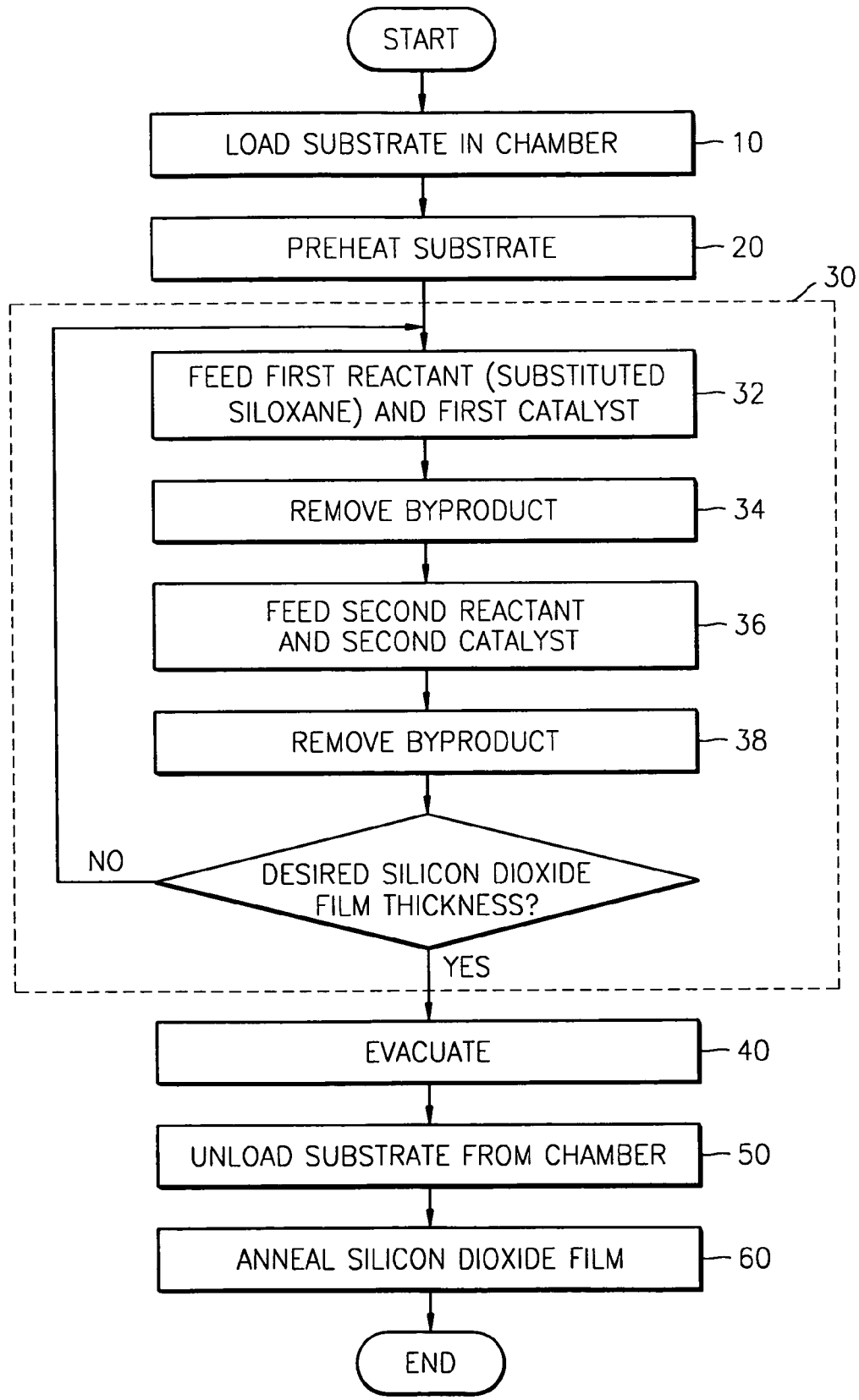
FIG. 1 is a flowchart showing a method for forming a silicon dioxide film according to a preferred embodiment of the present invention.

FIG. 1 is a flowchart showing a method for forming a silicon dioxide film (also referred to as "SiO$_2$ film", hereinafter) according to a preferred embodiment of the present invention. FIG. 1 schematically illustrates the several steps which apply generically to the methods of this invention for forming silicon dioxide films on a substrate by means of a catalyst-assisted atomic layer deposition (ALD) procedure.

In FIG. 1, first, a suitable semiconductor substrate is loaded into a chamber of a thin film forming apparatus (step 10). A suitable substrate in accordance with this invention has at least a surface having or treated to have —OH functional groups along the surface. Then, the substrate is preheated to a temperature suitable for forming a SiO$_2$ film in accordance with this invention, i.e., a temperature range of about 25–500° C. using a heater in the chamber or other step for heating the substrate (step 20). The preheating is typically carried out for about 60 seconds and typically in connection with evacuation of the chamber.

When the substrate reaches a desired temperature, a SiO$_2$ film is formed on the substrate using atomic layer deposition (ALD) in accordance with the present invention (step 30).

In step 30 (comprising sub-steps 32, 34, 36, 38 and a decision step based on whether the desired SiO$_2$ film thickness has been attained), first, a first reactant consisting essentially of a halogen- or NCO-substituted siloxane is introduced into the chamber together With an effective amount of a first basic catalyst to form a chemisorbed layer of the first reactant on the substrate surface (sub-step 32).

The first reactant is generally represented by the formula Si$_n$O$_{n-1}$X$_{2n+2}$, where n is an integer of 2 to 5 and X is a chemical group selected from F, Cl, Br, I, or NCO. By way of examples, the first reactant as used herein may be selected from the group consisting of Si$_2$OCl$_6$, Si$_3$O$_2$Cl$_8$, Si$_4$O$_3$Cl$_{10}$, Si$_2$OBr$_6$, Si$_3$O$_2$Br$_8$, Si$_4$O$_3$Br$_{10}$, Si$_2$O(NCO)$_6$ and Si$_3$O$_{2(NCO)8}$, or mixtures thereof. In a preferred embodiment, the first reactant is a halogen- or NCO-substituted disiloxane. Most preferably, the first, reactant is selected from the group consisting of Si$_2$OCl$_6$, Si$_2$OBr$_6$ and Si$_2$O(NCO)$_6$.

The first basic catalyst as used herein is preferably selected from pyridine (C$_2$H$_5$N) and an amine. More preferably, the first basic catalyst is a tertiary aliphatic amine compound having the general formula NR$_3$, where each R represents the same or a different aliphatic group having from 1 to 5 carbon atoms. In a specific preferred embodiment, the first basic catalyst is trimethylamine (C$_3$H$_9$N).

When the first reactant is introduced into the chamber, the temperature of the chamber is preferably maintained at a temperature of about 25–500° C., preferably in the range of about 50–150° C. In this case, the pressure of the chamber is preferably maintained in a range of about 0.1–100 Torr, preferably in a range of about 0.5–5 Torr. In one embodiment of the invention, the first reactant may be introduced into the chamber together with an inert gas, for example, an argon (Ar) gas.

During sub-step 32, OH functional groups on the substrate surface react with halogen atoms or NCO groups of the first reactant to produce an acid. The resultant acid is then neutralized with the first basic catalyst to produce a salt. At the same time, oxygen atoms on the substrate surface bond to a Si atom of the first reactant in a state wherein the Si—O—Si bond of the first reactant is kept. A chemisorbed layer of the first reactant is thereby formed on the substrate surface.

After the chemisorbed layer is formed, byproducts of sub-step 32, for example, the aforementioned salt, along with a physisorbed layer of the first reactant, along the substrate surface are removed (sub-step 34).

The byproducts and unreacted first reactant and catalyst are removed from the reaction chamber by means of inert gas purge, evacuation or both. In the inert gas purge, an inert gas such as argon (Ar) is used. The evacuation is carried out under a pressure lower than the pressure at which the first reactant is introduced into the chamber. The inert gas purge and evacuation may also be carried out in combination. In particular, it is possible to carry out first the purging process and then the evacuation or vice versa.

Subsequently in sub-step 36, a second reactant consisting essentially of oxygen atoms in compound or radical form is introduced into the chamber together with an effective amount of a second basic catalyst to form a SiO$_2$ film.

In a preferred embodiment of the invention, the second reactant is selected from the group consisting of H$_2$O, H$_2$O$_2$, ozone (O$_3$) and oxygen radical. The second basic catalyst may be the same as or different than the first basic catalyst.

In one embodiment of the invention, the temperature and pressure conditions of sub-step 36 are substantially the same as those of sub-step 32.

During sub-step 36, halogen atoms or NCO groups on the chemisorbed layer react with hydrogen atoms of the second reactant, resulting in the formation of an acid and a bond between a silicon atom of the chemisorbed layer and an oxygen atom of the second reactant. The resultant acid is then neutralized with the second basic catalyst to produce a salt. As a result, a Si—O—Si based monolayer is formed on the substrate surface. In particular, depending on the number of Si—O—Si bonds in the first reactant, a plurality of $SiO_2$ monolayers is formed on the substrate surface. For example, in the case of using a substituted disiloxane as the first reactant, two $SiO_2$ monolayers are formed on the substrate during sub-step 36.

In sub-step 38, the byproducts and unreacted second reactant and catalyst of sub-step 36 are then removed. Similar to sub-step 34, inert gas purge and evacuation can be utilized alone or in combination to carry out sub-step 38.

Sub-steps 32 to 38 are repeated until a $SiO_2$ film having a desired thickness is formed on the substrate surface. When a $SiO_2$ film with a desired thickness is formed, the chamber is subjected to evacuation for a predetermined time, for example, for about 90 seconds, in order to remove residual deposition byproducts (step 40). In this step of the process, no gases are introduced into the chamber. The substrate is then unloaded from the chamber (step 50).

In order to improve the resistance of the deposited $SiO_2$ film to a solution suitable for cleaning a $SiO_2$ film, in a preferred embodiment of this invention the $SiO_2$ film is annealed (step 60). The annealing step may be carried out within a temperature between about room temperature and 900° C. under a pressure of about 760 Torr or less, preferably about $10^{-9}$ to 760 Torr, for a period of about 5 minutes or less. Various annealing processes, such as a thermal treatment, a plasma treatment, and an ozone ($O_3$) treatment can be used in accordance with this aspect of the invention. A thermal annealing step might typically be carried out at a temperature of about 500–900° C. under an atmosphere of $N_2$, $O_2$, $H_2$, Ar, or mixtures thereof, a combination of $N_2$ and $O_2$, or an $NH_3$ gas. Preferably, the thermal annealing is carried out at a temperature of about 500–900° C. under a pressure of about $10^{-9}$ to 760 Torr and in an $N_2$ atmosphere for about 5 minutes or less. A plasma annealing step might be carried out at a temperature of about 200–700° C. under the atmosphere of a plasma of $O_2$ or $H_2$ gas. An ozone annealing step might be carried out at room temperature up to a temperature of about to 700° C. In an embodiment of the invention where the annealing is performed in-situ, the plasma or the ozone annealing processes are preferred.

As described above, according to the method for forming a $SiO_2$ film according to the present invention, a substituted siloxane is used as a Si source. Therefore, whenever ALD is completed once, depending on the number of Si—O—Si bonds in the siloxane, a plurality of $SiO_2$ monolayers is formed on the substrate surface. For this reason, the deposition rate is increased compared with prior art techniques.

Figure 2:
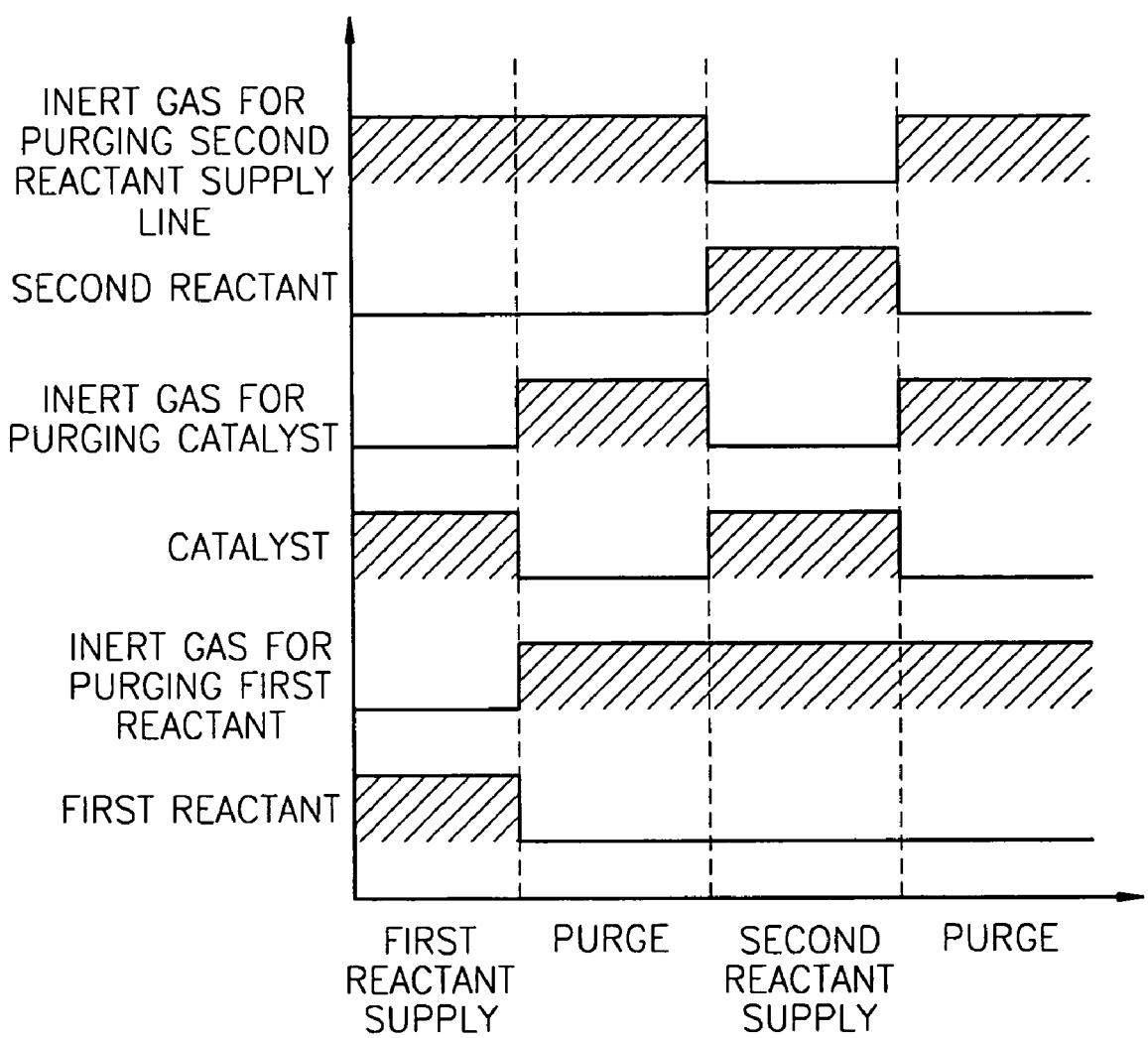
FIG. 2 is a gas pulsing diagram showing a representative supply program of process gases during the course of each atomic layer deposition (ALD) cycle according to a preferred embodiment of the present invention.
Figure 3:
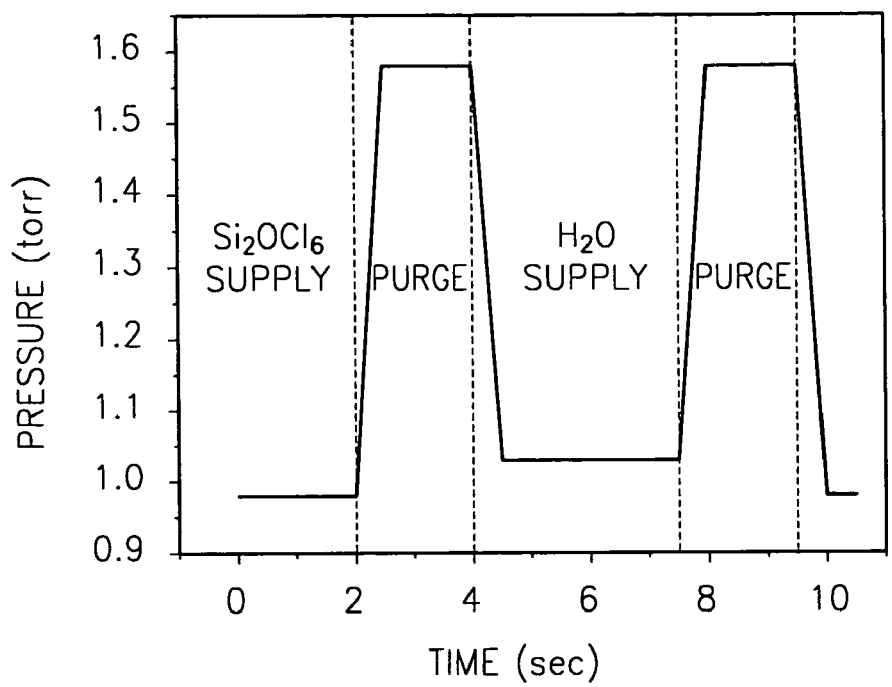
FIG. 3 is a graph illustrating variations in pressure over time during each ALD cycle according to one preferred embodiment of the present invention.
Figure 4:
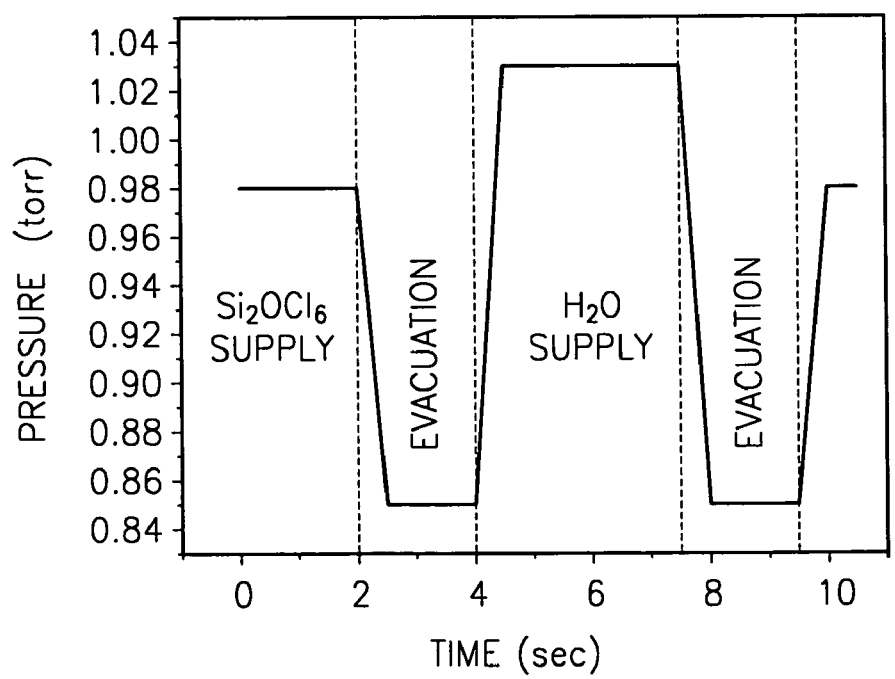
FIG. 4 is a graph illustrating variations in pressure over time during each ALD cycle according to another preferred embodiment of the present invention.
Figure 5:
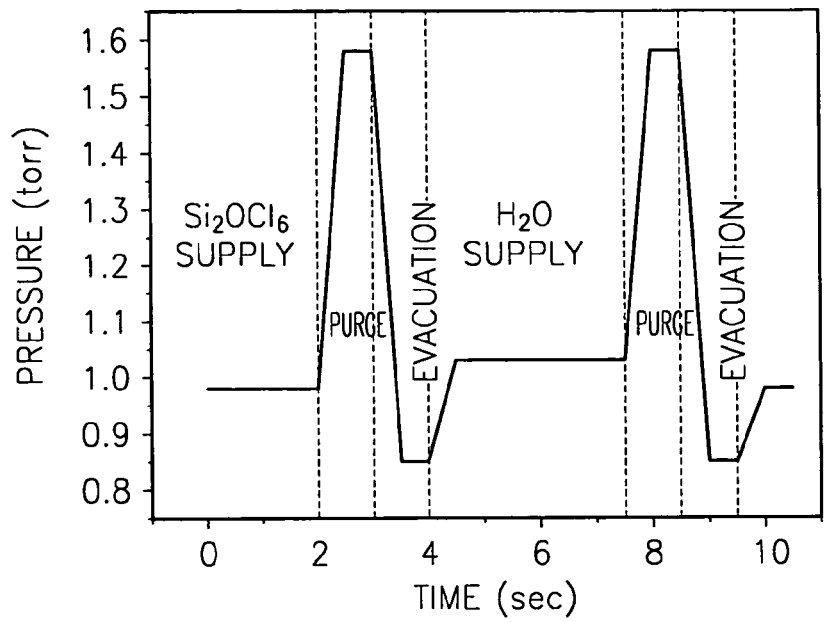
FIG. 5 is a graph illustrating variations in pressure over time during each ALD cycle according to still another preferred embodiment of the present invention.

FIG. 2 is a gas pulsing diagram showing a representative supply program of process gases in each ALD cycle according to a preferred embodiment of the present invention.

As shown in FIG. 2, in a first reactant supply step (corresponding to sub-step 32 of FIG. 1), a substituted siloxane as the first reactant and an amine as a first basic catalyst are introduced into a chamber via a first reactant supply line and a catalyst supply line, respectively. At the same time, an inert gas, for example, argon, being used here for purging a second reactant supply line is introduced into the chamber via the second reactant supply line thereby purging that line in preparation for subsequent steps.

After the first reactant supply step, a first purging step is carried out corresponding to sub-step 34 of FIG. 1. In particular, in this step in order to purge the first reactant supply line, the second reactant supply line, and the catalyst supply line, inert purging gases are introduced into the chamber via these three respective supply lines.

In a second reactant supply step corresponding to sub-step 36 of FIG. 1, a compound consisting of oxygen and hydrogen as the second reactant and a second basic catalyst are introduced into the chamber via the second reactant supply line and the catalyst supply line, respectively. At the same time, an inert gas, for example, argon, being used here for purging the first reactant supply line is introduced into the chamber via the first reactant supply line thereby purging that line in preparation for subsequent steps.

After the second reactant supply step, a second purging step is carried out corresponding to sub-step 38 of FIG. 1. Similar to the first purging step, in order to purge the first reactant supply line, the second reactant supply line, and the catalyst supply line, inert purging gases are introduced into the chamber via these three respective supply lines.

Figure 6:
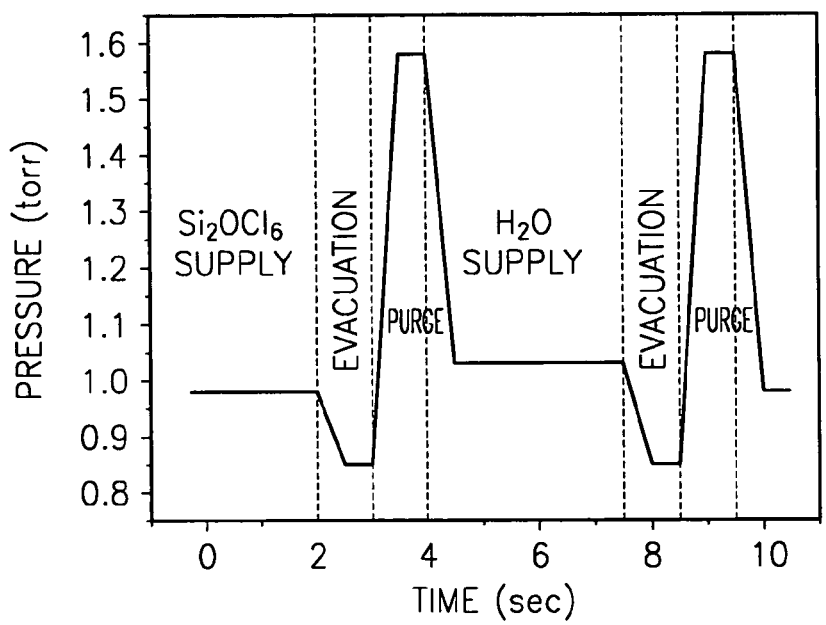
FIG. 6 is a graph illustrating variations in pressure over time during each ALD cycle according to yet another preferred embodiment of the present invention.

FIGS. 3 to 6 are graphs of variation in pressure with time in each ALD cycle according to alternative preferred embodiments of the present invention. Hexachlorodisiloxane ($Si_2OCl_6$) is used as the first reactant, $H_2O$ as the second reactant, and Ar as the purging gas. The temperature suitable for each embodiment is about 105° C. FIGS. 3 to 6 illustrate various useful methods for carrying out sub-steps 34 and 38 in FIG. 1. In particular, byproducts can be removed by means of Ar purge (FIG. 3), evacuation under a pressure lower than when the first and the second reactants are introduced into the chamber (FIG. 4), Ar purge followed by evacuation (FIG. 5), or evacuation followed by Ar purge (FIG. 6). The time periods for carrying out the various Ar purge, evacuation, or combined purge-and-evacuation or evacuation-and-purge steps, as illustrated in FIGS. 3 to 6, are intended for illustration only. Shorter or longer time periods for carrying out these steps may be determined by routine experimentation to be appropriate for a particular application of this invention.

Figure 7:
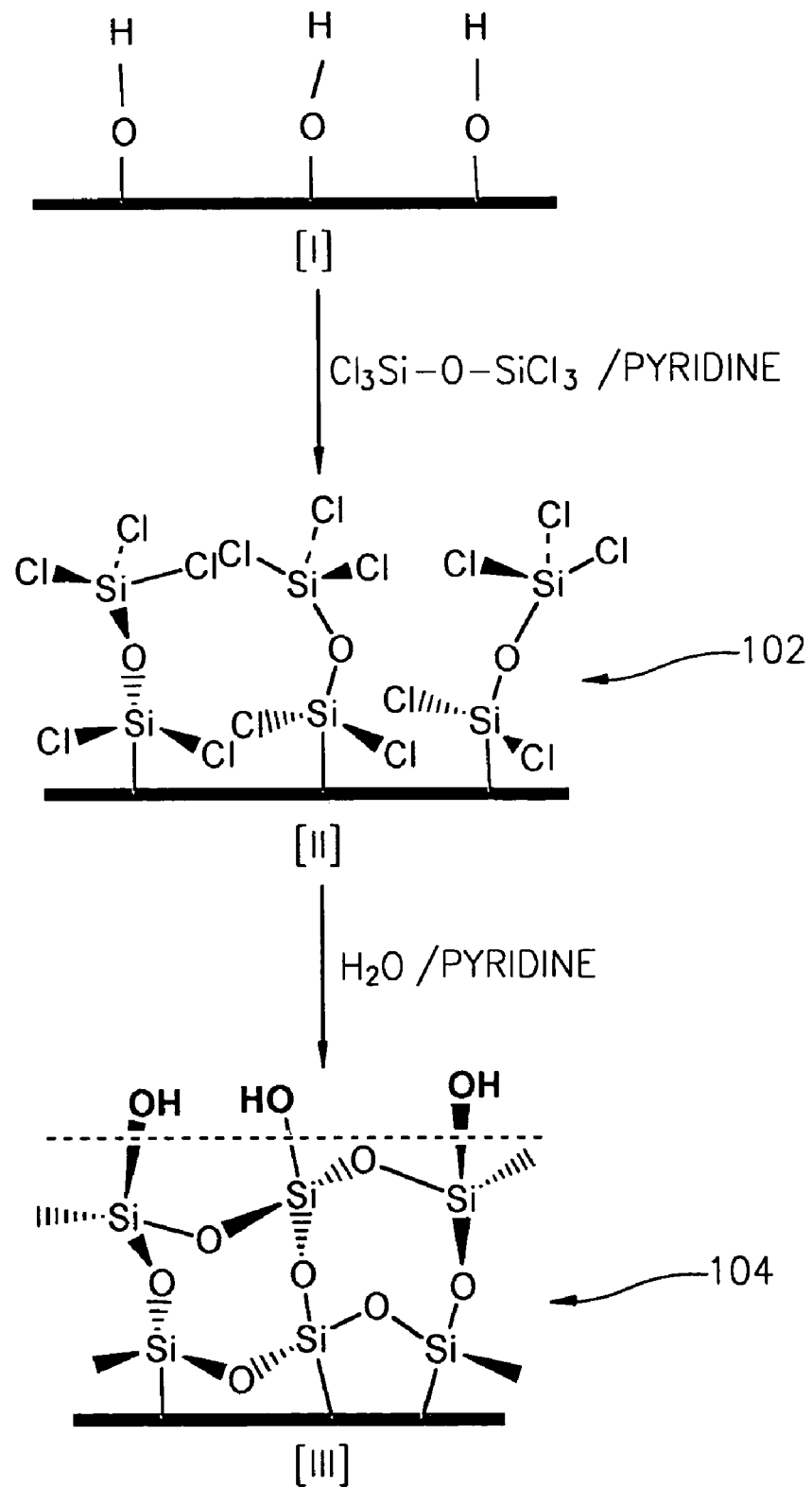
FIG. 7 is a schematic diagram illustrating what is believed to be the sequence of chemical reactions involved in forming a silicon dioxide film according to a preferred embodiment of the present invention.

FIG. 7 is a schematic diagram illustrating what is believed to be the sequence of chemical reactions involved in forming a silicon dioxide film during one ALD cycle according to a preferred embodiment of the present invention. Hexachlorodisiloxane ($Si_2OCl_6$) is used as the first reactant and $H_2O$ as the second reactant for purposes of this illustration.

Referring to FIG. 7, a suitable substrate has an OH functional group on the surface thereof as seen in part [I] of FIG. 7. As described in sub-step 32 of FIG. 1, when the substrate surface is exposed to $Si_2OCl_6$ and pyridine, an OH functional group on the substrate surface reacts with $Si_2OCl_6$ to produce HCl acid and to establish a chemical bond between an O atom of the substrate and an Si atom of $Si_2OCl_6$. As a result, a chemisorbed layer 102 is formed on the substrate as seen in part [II] of FIG. 7. At the same time, the HCl acid is neutralized with the pyridine present to produce a salt byproduct.

The salt byproduct of the formation of the chemisorbed layer 102 and other byproducts and unreacted reactant and catalyst are then purged from the chamber, as previously described. Then, as described in sub-step 36 of FIG. 1, the substrate is exposed to $H_2O$ and pyridine. $H_2O$ reacts with the chemisorbed layer 102 to produce additional HCl acid and to establish a chemical bond between an O atom of $H_2O$ and an Si atom of the chemisorbed layer 102. As a result, two $SiO_2$ monolayers 104 are formed on the substrate surface as seen in part [III] of FIG. 7. The additional HCl acid produced in this process step is neutralized with the pyridine present to produce a salt. The salt and other byproducts and unreacted reactant and catalyst are then purged from the chamber, as previously described.

As shown in FIG. 7, according to an ALD process of the present invention, a substituted siloxane is used as a Si source. Because a strong Si—O—Si bond is present in such a substituted siloxane, the resultant silicon dioxide film has been found to have excellent film quality. In the embodiment where $Si_2OCl_6$ is used as the Si source, two $SiO_2$ monolayers are formed whenever one ALD cycle is completed, thereby increasing the $SiO_2$ deposition rate. Meanwhile, the $Si_2OCl_6$ molecule has three Si—Cl bonds per one Si atom. For this reason, the ALD process of the present invention leaves fewer remaining O—H bonds along the substrate surface than with a conventional ALD process using $SiCl_4$ as a Si source. It is believed that this surprising improvement in film quality is realized because $Si_2OCl_6$ has relatively fewer Si—Cl bonds than $SiCl_4$. Therefore, according to the present invention, the number of remaining O—H bonds on the silicon dioxide film can be drastically reduced.

Silicon dioxide films formed according to the several above-described embodiments of the present invention can be applied in a highly integrated semiconductor device manufacturing process. By way of examples, a silicon dioxide film according to this invention can be used: as a sidewall spacer of a gate electrode formed on a semiconductor substrate; as a gate dielectric film on a semiconductor substrate; as a silicide-blocking layer; as a sidewall spacer of a bit line formed on a semiconductor substrate; as an interlayer insulating layer on a semiconductor substrate; or as an etching prevention layer for protecting a predetermined layer on a semiconductor substrate. In the case where the silicon dioxide film is used as an etching prevention layer, the silicon dioxide film may be used alone or in combination with a silicon nitride film. Conventionally, the silicon nitride film is mainly used as an etching prevention layer during dry etching to prevent damage to a predetermined layer on a semiconductor substrate. In this case, due to over-etching of the silicon nitride film, the surface of the predetermined layer under the silicon nitride film tends to be hollowed into a recess. In order to prevent such a recess, a silicon dioxide film prepared according to the present invention can be introduced between the predetermined layer and the silicon nitride film.

Silicon dioxide films formed according to the present invention can also be applied in various steps of a highly integrated semiconductor device manufacturing process, but such applications are not limited to the illustrating examples as mentioned above.

Additional examples of the present invention, as described below, will further illustrate aspects of this invention.

EVALUATION EXAMPLE 1

Silicon dioxide films prepared in different ways were evaluated to determine their comparative surface qualities. For this example, silicon dioxide films according to the present invention were formed on a substrate using hexachlorodisiloxane (simply referred to here as "HCDSO", hereinafter) as a first reactant, $H_2O$ as a second reactant, and pyridine as a basic catalyst, under the conditions presented in Table 1 below.

TABLE 1

| Temp. (° C.) | Flow rate of HCDSO (sccm) | Flow rate of $H_2O$ (sccm) | Flow rate of pyridine (sccm) | Flow rate of purging Ar (sccm) | Supply time of HCDSO (sec) | Supply time of $H_2O$ (sec) | Purging time (sec) |
|---|---|---|---|---|---|---|---|
| 105 | 250 | 700 | 80 | 400 | 2 | 3.5 | 2 |

As a control, silicon dioxide films were formed under substantially the same conditions as presented in Table 1 except using hexachlorodisilane ($Si_2Cl_6$: simply referred to here as "HCD", hereinafter) as a Si source.

The reflective index of each of the HCDSO- and HCD-based silicon dioxide films was evaluated. The reflective index of the HCD-based silicon dioxide films was found to be 1.50 to 1.51. On the other hand, the reflective index of the HCDSO-based silicon dioxide films was found to be 1.44 to 1.46, which corresponds to that of stoichiometric $SiO_2$ films, and thus represents an improvement in the quality of the $SiO_2$ films.

EVALUATION EXAMPLE 2

Figure 8:
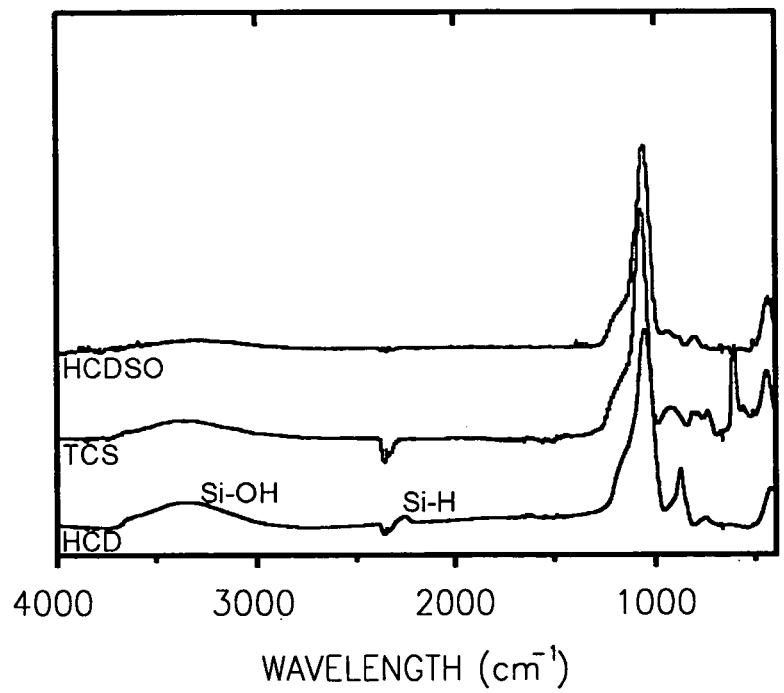
FIG. 8 is a Fourier Transfer Infrared spectrometer (FTIR) comparing the spectrum of a silicon dioxide film prepared according to the method of the present invention (HCDSO) and with the spectra of two silicon dioxide films prepared according to conventional methods (HCD and TCS)

Each of several HCDSO- and HCD-based silicon dioxide films was formed under the same conditions as presented in Table 1 except that a temperature of 75° C. was used instead. The Fourier Transfer Infrared spectrometer (FTIR) spectrum of each of these silicon dioxide films was then measured, and the results are shown in FIG. 8. Furthermore, the FTIR spectrum of several silicon dioxide films formed using tetrachlorosilane ($SiCl_4$: simply referred to as "TCS", hereinafter) were measured, and these results are also shown in FIG. 8 for comparison purposes.

As shown in FIG. 8, the FTIR spectrum of the HCDSO-based silicon dioxide films exhibited very weak Si—OH and Si—H peaks. This indicates that the content of OH and H is very low in these HCDSO-based silicon dioxide films, which means these are less porous and therefore improved quality films.

EVALUATION EXAMPLE 3

Figure 9:
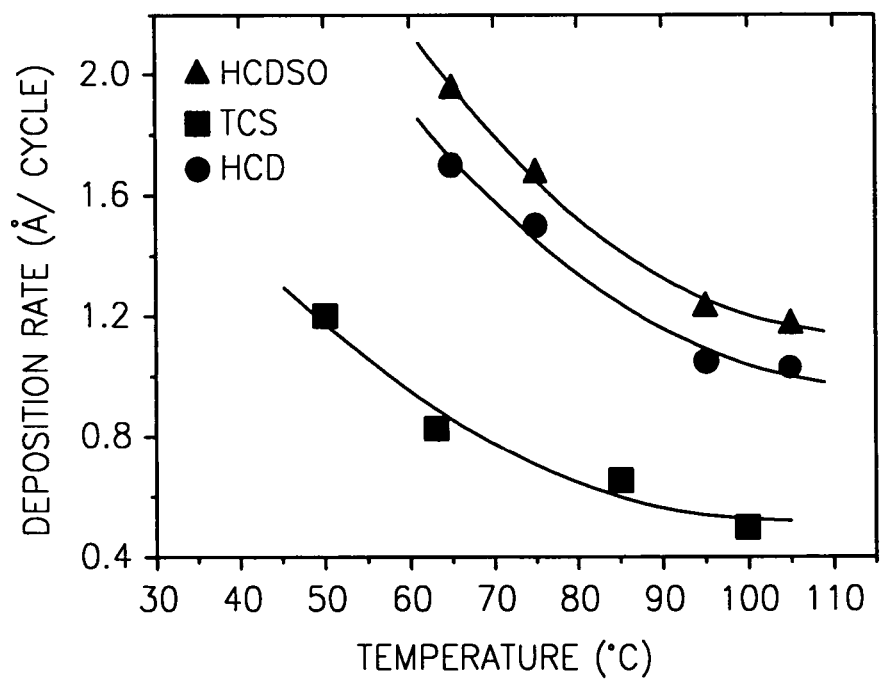
FIG. 9 is a graph illustrating the variation in deposition rates of silicon dioxide films with temperature according to the method of the present invention (HCDSO) and according to two conventional methods (HCD and TCS).

FIG. 9 is a graph illustrating the variation in deposition rate of silicon dioxide films with temperature. In FIG. 9, ▲ represents HCDSO-based silicon dioxide films formed according to the present invention, ■ represents TCS-based silicon dioxide films formed according to one conventional process, and ● represents HCD-based silicon dioxide films formed according to another conventional process.

As shown in FIG. 9, the HCDSO-based silicon dioxide films (▲) had remarkably improved deposition rates over the entire temperature range, compared to the TCS- and HCD-based silicon dioxide films. This improved result is believed to be attributable to the use of a disiloxane, HCDSO, in accordance with this invention as the Si source. That is, in the case of the HCDSO-based silicon dioxide films, two $SiO_2$ monolayers are formed whenever one ALD cycle is completed, resulting in increasing the deposition rate.

As apparent from the above description, according to the present invention, a substituted siloxane with two or more Si atoms is preferably used as a Si source. Silicon dioxide films formed according to the present invention have been found to provide excellent film quality due to a strong Si—O—Si bond in the siloxane. As a result, impurities in the film are decreased. Furthermore, because a plurality of $SiO_2$ monolayers are formed whenever one ALD cycle is completed, the deposition rate is increased. Therefore, the process duration according to this invention is remarkably reduced, leading to enhanced throughput.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for forming a silicon dioxide film on the surface of a substrate using a catalyst-assisted atomic layer deposition process, said method comprising the sequential steps of:
   (a) feeding a halogen- or NCO-substituted siloxane as a first reactant onto a substrate together with a first catalyst to form a chemisorbed layer comprising the first reactant; and
   (b) feeding a second reactant onto the chemisorbed layer together with a second catalyst to form the silicon dioxide film on the substrate.

2. The method according to claim 1, wherein the first reactant is a siloxane represented by the formula $Si_nO_{n-1}X_{2n+2}$, where n is an integer of 2 to 5, and X is a chemical group selected from F, Cl, Br, I or NCO.

3. The method according to claim 1, wherein the first reactant is a halogen- or NCO-substituted disiloxane.

4. The method according to claim 1, wherein the first reactant is selected from the group consisting of $Si_2OCl_6$, $Si_2OBr_6$, and $Si_2O(NCO)_6$.

5. The method according to claim 1, wherein the second reactant is a component selected from the group consisting of oxygen (O) atoms in compound or radical form.

6. The method according to claim 5, wherein the second reactant is selected from $H_2O$, $H_2O_2$, ozone ($O_3$) or oxygen radical.

7. The method according to claim 1, wherein in step (a), the first catalyst is a first basic catalyst.

8. The method according to claim 1, wherein in step (b), the second catalyst is a second basic catalyst.

9. The method according to claim 1, wherein steps (a) and (b) are carried out at a temperature of about 25–500° C.

10. The method according to claim 1, wherein steps (a) and (b) are carried out under a pressure of about 0.1–100 Torr.

11. The method according to claim 1, wherein in steps (a) and (b), the first and the second reactants and the respective first and second catalysts are fed onto the substrate together with an inert gas.

12. The method according to claim 1, further comprising the steps of repeating steps (a) and (b) sequentially until a silicon dioxide film having a predetermined thickness greater than two $SiO_2$ monolayers is thereby formed.

13. The method according to claim 12, further comprising the step of annealing the silicon dioxide film after the final step (b).

14. The method according to claim 13, wherein the annealing step is carried out using a process selected from a heat treatment, a plasma treatment, or an ozone treatment.

15. The method according to claim 13, wherein the annealing is carried out at a temperature of about 500–900° C. under an atmosphere of $N_2$, $O_2$, $H_2$, Ar, or mixtures thereof, a combination of $N_2$ and $O_2$ gas, or an $NH_3$ gas.

16. The method according to claim 13, wherein the annealing step is carried out using a plasma treatment at a temperature of about 200–700° C. under an atmosphere of an $O_2$ or $H_2$ gas.

17. The method according to claim 13, wherein the annealing step is carried out using an ozone treatment within a temperature range between room temperature and about 700° C.

18. The method according to claim 1, further comprising first and second byproduct removal steps of removing at least a first byproduct from the region surrounding the substrate after step (a) and removing at least a second byproduct from the region surrounding the substrate after step (b).

19. The method according to claim 18, wherein the first and the second byproduct removal steps are carried out by means of (i) an inert gas purge, (ii) an evacuation under a pressure lower than when the first and the second reactants respectively are fed onto the substrate, or (iii) an inert gas purge and evacuation in combination.

20. The method according to claim 1, further comprising the step of preheating the substrate to a temperature of about 25–500° C. before step (a).

21. A method for forming a silicon dioxide film on the surface of a substrate using a catalyst-assisted atomic layer deposition process, said method comprising the sequential steps of:
   (a) loading a substrate in a chamber;
   (b) introducing a siloxane compound represented by the formula $Si_nO_{n-1}X_{2n+2}$, where n is an integer of 2 to 5, and X is a chemical group selected from F, Cl, Br, I or NCO, as a first reactant together with a first catalyst into the chamber to produce a chemisorbed layer comprising the first reactant on the substrate;
   (c) removing at least a byproduct of step (b) from the chamber;
   (d) introducing a second reactant together with a second catalyst into the chamber to react with the chemisorbed layer on the substrate to produce a silicon dioxide film on the substrate; and
   (e) removing at least a byproduct of step (d) from the chamber.

22. The method according to claim 21, further comprising the steps of repeating steps (a) through (e) sequentially until a silicon dioxide film having a predetermined thickness greater than two $SiO_2$ monolayers is thereby formed.

23. The method according to claim 21, further comprising the step of preheating the substrate to a temperature of about 25–500° C. after step (a) and before step (b).

24. The method according to claim 21, wherein the first reactant is selected from the group consisting of $Si_2OCl_6$, $Si_2OBr_6$ and $Si_2O(NCO)_6$.

25. The method according to claim 21, wherein the second reactant is a component selected from the group consisting of oxygen (O) atoms in compound or radical form.

26. The method according to claim 25, wherein the second reactant is selected from the group consisting of $H_2O$, and $H_2O_2$, ozone ($O_3$) and oxygen radical.

27. The method according to claim 21, wherein the first and second catalysts are pyridine or amine, respectively.

28. The method according to claim 21, wherein steps (b) and (d) are carried out at a temperature of about 25–500° C.

29. The method according to claim 21, wherein steps (b) and (d) are carried out under a pressure of about 0.1–100 Torr.

30. The method according to claim 21, wherein, in steps (b) and (d), the first and the second reactants and the respective first and second catalysts are introduced into the chamber together with an inert gas.

31. The method according to claim 21, wherein steps (c) and (e) are carried out by means of a step selected from: (i) an inert gas purge, (ii) an evacuation under a pressure lower than when the first and the second reactants are introduced into the chamber, and (iii) an inert gas purge and evacuation used in combination.

32. The method according to claim 21, further comprising the step of annealing the silicon dioxide film after step (e).

33. The method according to claim 32, wherein the annealing step is carried out using a heat treatment, a plasma treatment, or an ozone treatment.

34. A method for forming a silicon dioxide film on the surface of a substrate for semiconductor applications using a catalyst-assisted atomic layer deposition process, said method
comprising at least the sequential steps of exposing a functionalized surface of the substrate to a first reactant mixture consisting essentially of first reactant and first catalyst and thereafter exposing that surface to a second reactant mixture consisting essentially of second reactant and second catalyst to form a silicon dioxide monolayer on the substrate surface, wherein
the first reactant consists essentially of at least one member selected from the group consisting of halogen- and NCO-substituted siloxanes.

35. The method according to claim 34, wherein the first reactant consists essentially of a siloxane represented by the formula $Si_nO_{n-1}X_{2n+2}$, where n is an integer of 2 to 5, and X if a chemical selected from the group consisting of F, Cl, Br, I and NCO.

36. The method according to claim 35, wherein said method further comprises the steps of removing unreacted reactant, the first catalyst or the second catalyst, and reaction byproducts from the region of the substrate following each reaction step.

37. The method according to claim 34, wherein the first reactant is halogen- or NCO-substituted disiloxane.

38. The method according to claim 37, wherein the first reactant is selected from the group consisting of $Si_2OCl_6$, $Si_2OBr_6$, and $Si_2O(NCO)_6$.

39. The method according to claim 34, wherein said first catalyst is selected from the group consisting of pyridine and amine.

40. The method according to claim 34, wherein said first catalyst consists essentially of a tertiary aliphatic amine compound having the general formula $NR_3$, where each R represents the same or a different aliphatic group having from 1 to 5 carbon atoms.

41. The method according to claim 34, wherein said first catalyst consists essentially of trimethyl amine.

42. The method according to claim 34, wherein said first reactant consists essentially of $Si_2OCl_6$ and said first catalyst consists essentially of trimethyl amine.

43. The method according to claim 34, wherein the steps are carried out at a temperature ranging from about 25–500° C.

44. The method according to claim 34, wherein the steps are carried out at a pressure ranging from about 0.1–100 Torr.

45. The method according to claim 34, wherein the first catalyst and second catalyst are the same.

46. The method according to claim 34, wherein said method further comprises the steps of removing unreacted reactant, the first catalyst or the second catalyst, and reaction byproducts from the region of the substrate following each reaction step.

47. The method according to claim 46, wherein the first reactant, second reactant, the first catalyst and the second catalyst are each supplied to the substrate surface by separate feed lines.

48. The method according to claim 47, comprising the following deposition cycle: (a) a first reaction period during which first reactant and first catalyst are fed respectively through first reactant and first catalyst feed lines to the substrate surface along with inert gas fed through a second reactant feed line; (b) a first purge period during which the feeds of first reactant and first catalyst are stopped and, instead, inert gas is fed through each of the first and second reactant and catalyst feed lines; (c) a second reaction period during which second reactant and second catalyst are fed respectively through second reactant and second catalyst feed lines to the substrate surface along with inert gas fed through the first reactant feed line; and (d) a second purge period during which the feeds of second reactant and second catalyst are stopped and, instead, inert gas is fed through each of the first and second reactant and catalyst feed lines.

49. The method according to claim 48, further comprising the steps of repeating the deposition cycle multiple times on the same substrate to obtain a silicon dioxide film of a desired thickness.

50. The method according to claim 48, wherein said first catalyst and said second catalyst are the same, and wherein said first catalyst feed line and said second catalyst feed line are the same feed line.

51. The method according to claim 34, further comprising the steps of repeating the deposition cycle multiple times on the same substrate to obtain a silicon dioxide film of a desired thickness.

52. The method according to claim 34, further comprising a step of annealing the deposited silicon dioxide film.

53. The method according to claim 52, wherein the annealing step is selected from one of the following:
a heat treatment at a temperature of about 500–900° C. under an atmosphere of $N_2$, $O_2$, $H_2$, Ar, and mixtures thereof, a combination of $N_2$ and $O_2$ gas, or an $NH_3$ gas;
a plasma treatment about 200–700° C. under an atmosphere of an $O_2$ or $H_2$ gas; or
an ozone treatment within a temperature range between about room temperature and about 700° C.

54. The method according to claim 34, comprising for each atomic layer deposition a purge-pumping procedure according to the following sequence: feeding the first reactant and first catalyst to a region containing the substrate during a process time period $t_1$; purging the region with an inert gas during a time period $t_2$ immediately following period $t_1$; pumping the region to at least partially evacuate inert gas and other gaseous materials from the region during a time period $t_3$ immediately following period $t_2$; feeding the second reactant and second catalyst to the region during a time period $t_4$ immediately following period $t_3$; purging the region with an inert gas during a time period $t_5$ immediately following period $t_4$; and pumping the region to at least partially evacuate inert gas and other gaseous materials from the region during a time period $t_6$ immediately following period $t_5$.

55. The method according to claim 34, comprising for each atomic layer deposition a pumping-purge procedure according to the following sequence: feeding the first reactant and first catalyst to a region containing the substrate during a process time period $t_1$; pumping the region to at least partially evacuate gaseous materials from the region during a time period $t_2$ immediately following period $t_1$; purging the region with an inert gas during a time period $t_3$ immediately following period $t_2$; feeding the second reactant and second catalyst to the region during a time period $t_4$ immediately following period $t_3$; pumping the region to at least partially evacuate gaseous materials from the region during a time period $t_5$ immediately following period $t_4$; and, purging the region with an inert gas during a time period $t_6$ immediately following period $t_5$.

* * * * *